(12) United States Patent
Kuo

(10) Patent No.: US 7,241,672 B2
(45) Date of Patent: Jul. 10, 2007

(54) METHOD AND APPARATUS FOR RAPID COOLDOWN OF ANNEALED WAFER

(75) Inventor: Chia-Chu Kuo, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 53 days.

(21) Appl. No.: 10/773,517

(22) Filed: Feb. 6, 2004

(65) Prior Publication Data

US 2005/0142868 A1   Jun. 30, 2005

(30) Foreign Application Priority Data

Dec. 30, 2003  (CN) .................. 2003 1 0122958

(51) Int. Cl.
*H01L 21/425*  (2006.01)
(52) U.S. Cl. ................. 438/530; 438/540; 438/800
(58) Field of Classification Search ........... 438/800, 438/530, 540, 305, 301
See application file for complete search history.

(56) References Cited

U.S. PATENT DOCUMENTS

| 4,802,441 A | * | 2/1989 | Waugh ................. 118/666 |
| 6,200,432 B1 | * | 3/2001 | Kobayashi et al. .... 204/192.12 |
| 6,435,869 B2 | * | 8/2002 | Kitamura ............... 432/253 |
| 2004/0009644 A1 | * | 1/2004 | Suzuki ................. 438/270 |

* cited by examiner

*Primary Examiner*—Michael Trinh
(74) *Attorney, Agent, or Firm*—Townsend and Townsend and Crew LLP

(57) ABSTRACT

A method for annealing a semiconductor substrate. The method includes turning on at least one heat source, heating a semiconductor substrate in a chamber, turning off the at least one heat source, and cooling the semiconductor substrate in the chamber. The heating a semiconductor substrate includes absorbing an energy from the at least one heat source by the semiconductor substrate. Moreover, the cooling the semiconductor substrate includes flowing a first gas in a vicinity of at least one wall of the chamber, flowing a second gas in a vicinity of the at least one heat source, and flowing a third gas in a vicinity of the semiconductor substrate.

16 Claims, 7 Drawing Sheets

METHOD AND APPARATUS FOR RAPID COOLDOWN OF ANNEALED WAFER

CROSS-REFERENCES TO RELATED APPLICATIONS

Not Applicable

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed to integrated circuits and their processing for the manufacture of semiconductor devices. More particularly, the invention provides a method and apparatus for rapid cool-down of annealed wafer for the manufacture of integrated circuits. Merely by way of example, the invention has been applied to spike anneals for source and drain dopant activation for the manufacture of integrated circuits. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is the cool-down rate of annealed wafers used for the manufacture of integrated circuits.

Fabrication of custom integrated circuits using chip foundry services has evolved over the years. Fabless chip companies often design the custom integrated circuits. Such custom integrated circuits require a set of custom masks commonly called "reticles" to be manufactured. A chip foundry company called Semiconductor International Manufacturing Company (SMIC) of Shanghai, China is an example of a chip company that performs foundry services. Although fabless chip companies and foundry services have increased through the years, many limitations still exist. For example, the limited cool-down rate of annealed wafer cannot usually effectively control thermal budget of anneals. These and other limitations are described throughout the present specification and more particularly below.

FIG. 1 is a simplified diagram for wafer temperature during furnace anneal or rapid thermal anneal. During wafer anneals, the wafer temperature changes with time. During time period 110, the wafer temperature remains at the pre-anneal temperature. During time period 120, the wafer temperature increases from the pre-annealed temperature to the anneal temperature. During time period 130, the wafer temperature remains steady at the anneal temperature. During time period 140, the wafer temperature decreases from the anneal temperature to the post-anneal temperature. The post-anneal temperature usually equals the pre-anneal temperature. During time period 150, the wafer temperature remains at the post-anneal temperature. At a feature size of 0.35 µm, time period 130 is usually one or several minutes, and the anneal process is usually performed in a furnace. At a feature size between roughly 0.25 µm and 0.15 µm, time period 130 usually ranges from about 5 seconds to about 30 seconds. The anneal process is usually performed in a single furnace, and is called rapid thermal anneal. As shown in FIG. 1, the anneal contributes to the thermal budget in the amount represented by area 160. Area 160 is determined at least in part by the anneal temperature, the length of time period 130, the ramp-up rate during time period 120, and the ramp-down rate during time period 130. In order to reduce feature size, the thermal budget should usually be lowered.

From the above, it is seen that an improved technique for processing semiconductor devices is desired.

BRIEF SUMMARY OF THE INVENTION

The present invention is directed to integrated circuits and their processing for the manufacture of semiconductor devices. More particularly, the invention provides a method and apparatus for rapid cool-down of annealed wafer for the manufacture of integrated circuits. Merely by way of example, the invention has been applied to spike anneals for source and drain dopant activation for the manufacture of integrated circuits. But it would be recognized that the invention has a much broader range of applicability.

In a specific embodiment, the invention provides a method for annealing a semiconductor substrate. The method includes turning on at least one heat source, heating a semiconductor substrate in a chamber, turning off the at least one heat source, and cooling the semiconductor substrate in the chamber. The heating a semiconductor substrate includes raising a temperature of the semiconductor substrate from a first temperature value to a second temperature value. The cooling the semiconductor substrate includes lowering the temperature of the semiconductor substrate from the second temperature value to a third temperature value. Additionally, the heating a semiconductor substrate includes absorbing an energy from the at least one heat source by the semiconductor substrate. Moreover, the cooling the semiconductor substrate includes flowing a first gas in a vicinity of at least one wall of the chamber, flowing a second gas in a vicinity of the at least one heat source, and flowing a third gas in a vicinity of the semiconductor substrate. A first temperature of the first gas is lower than the second temperature value, a second temperature of the second gas is lower than the second temperature value, and a third temperature of the third gas is lower than the second temperature value.

According to another embodiment, a method for annealing a semiconductor substrate includes heating a semiconductor substrate in a chamber, and cooling the semiconductor substrate in the chamber. The heating a semiconductor substrate includes raising a temperature of the semiconductor substrate from a first temperature value to a second temperature value. The cooling the semiconductor substrate includes lowering the temperature of the semiconductor substrate from the second temperature value to a third temperature value. Additionally, the heating a semiconductor substrate includes absorbing an energy from at least one heat source by the semiconductor substrate. The cooling the semiconductor substrate includes flowing a first gas in a vicinity of at least one wall of the chamber, flowing a second gas in a vicinity of the at least one heat source, and flowing a third gas in a vicinity of the semiconductor substrate. A first temperature of the first gas is lower than the third temperature value, a second temperature of the second gas is lower than the third temperature value, and a third temperature of the third gas is lower than the third temperature value.

According to yet another embodiment, a method for annealing a semiconductor substrate includes heating a semiconductor substrate in a chamber and cooling the semiconductor substrate in the chamber. The heating a semiconductor substrate includes raising a temperature of the semiconductor substrate from a first temperature value to a second temperature value. The cooling the semiconductor substrate includes lowering the temperature of the semiconductor substrate from the second temperature value to a third temperature value. Additionally, the heating a semiconductor substrate includes absorbing an energy from at least one lamp by the semiconductor substrate. The cooling the semiconductor substrate includes flowing a first gas in a vicinity of the at least one lamp, and flowing a second gas in a vicinity of the semiconductor substrate. A first temperature of the first gas is lower than the third temperature value, and a second temperature of the second gas is lower than the third temperature value.

According to yet another embodiment, a method for annealing a semiconductor substrate includes turning on at least one heat source and heating a semiconductor substrate in a chamber. The semiconductor substrate includes a source region and a drain region. The source region includes a source LDD region, and the drain region includes a drain LDD region. Additionally, the method includes turning off the at least one heat source, and cooling the semiconductor substrate in the chamber. The heating a semiconductor substrate includes raising a temperature of the semiconductor substrate from a first temperature value to a second temperature value. The cooling the semiconductor substrate includes lowering the temperature of the semiconductor substrate from the second temperature value to a third temperature value. Moreover, the heating a semiconductor substrate includes absorbing an energy from the at least one heat source by the semiconductor substrate. The cooling the semiconductor substrate includes flowing a first gas in a vicinity of at least one wall of the chamber, flowing a second gas in a vicinity of the at least one heat source, and flowing a third gas in a vicinity of the semiconductor substrate. A first temperature of the first gas is lower than the second temperature value, a second temperature of the second gas is lower than the second temperature value, and a third temperature of the third gas is lower than the second temperature value.

Many benefits are achieved by way of the present invention over conventional techniques. For example, the present technique provides an easy to use process that relies upon conventional technology. In some embodiments, the method provides rapid cool-down of annealed wafers. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits and their processing for the manufacture of semiconductor devices. More particularly, the invention provides a method and apparatus for rapid cool-down of annealed wafer for the manufacture of integrated circuits. Merely by way of example, the invention has been applied to spike anneals for source and drain dopant activation for the manufacture of integrated circuits. But it would be recognized that the invention has a much broader range of applicability.

Figure 1:
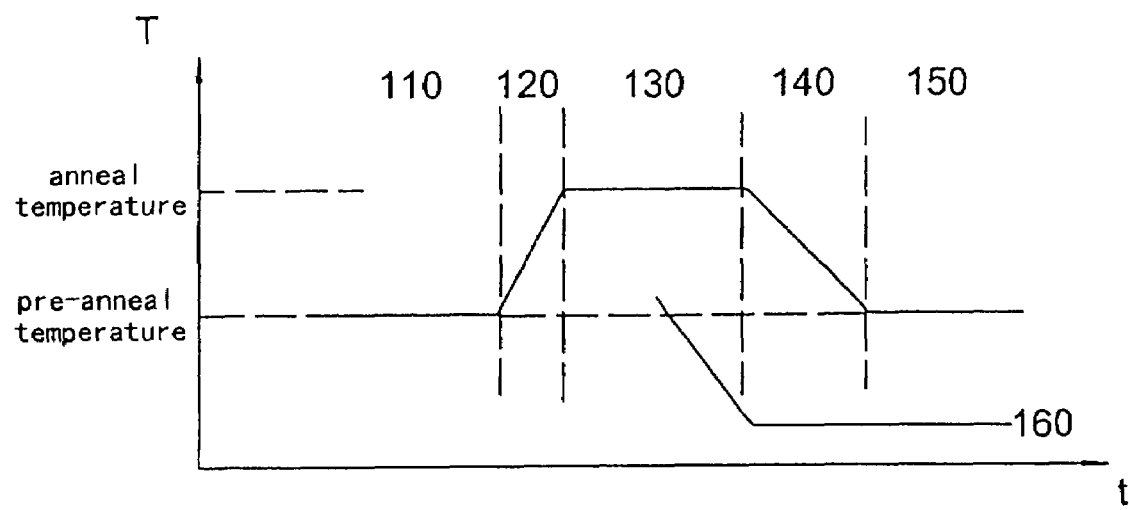
FIG. 1 is a simplified diagram for wafer temperature during furnace anneal or rapid thermal anneal.
Figure 2:
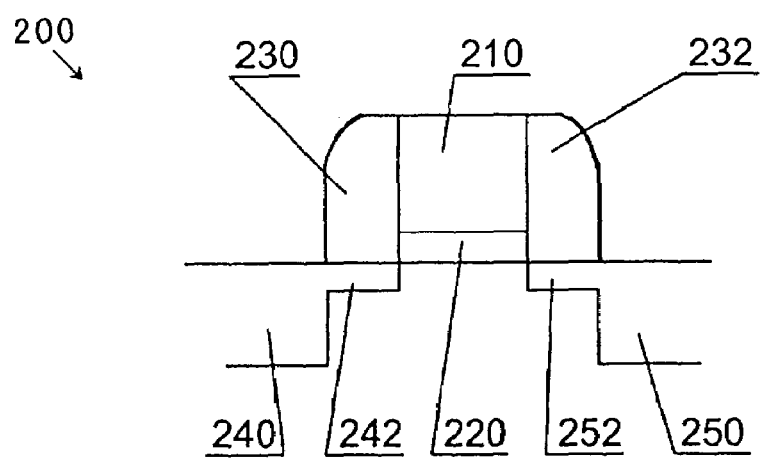
FIG. 2 is a simplified diagram for a semiconductor device using spike anneal during fabrication.

FIG. 2 is a simplified diagram for a semiconductor device using spike anneal during fabrication. This diagram is merely an example, which should not unduly limit the scope of the claims herein. Device 200 includes gate 210, insulating layer 220, spacers 230 and 232, drain 240, and source 250. Drain 240 includes drain LDD region 242, and source 250 includes source LDD region 252. During the fabrication of device 200, drain 240 and source 250 are usually annealed in order to activate dopants in these two regions. To activate the dopants, drain 240 and source 250 are usually annealed at an elevated anneal temperature. If the anneal temperature is not sufficiently high, the dopants usually cannot be effectively activated.

Another requirement of the anneal process is to limit the diffusion of dopants in order to control thickness of drain 240 and thickness of source 250, especially thickness of LDD drain region 242 and thickness of LDD source region 252. The diffusion usually increases exponentially with anneal temperature and anneal time. To control diffusion, the anneal temperature and the anneal time should usually be limited. But the anneal temperature needs to be sufficiently high to effectively activate dopants; thus the anneal time needs to be shortened. Reduction of the anneal time may be achieved by using spike anneal. As noted above and further emphasized here, device 200 in FIG. 2 is only an example. One of ordinary skill in the art would recognize many variations, alternatives, and modifications.

Figure 3:
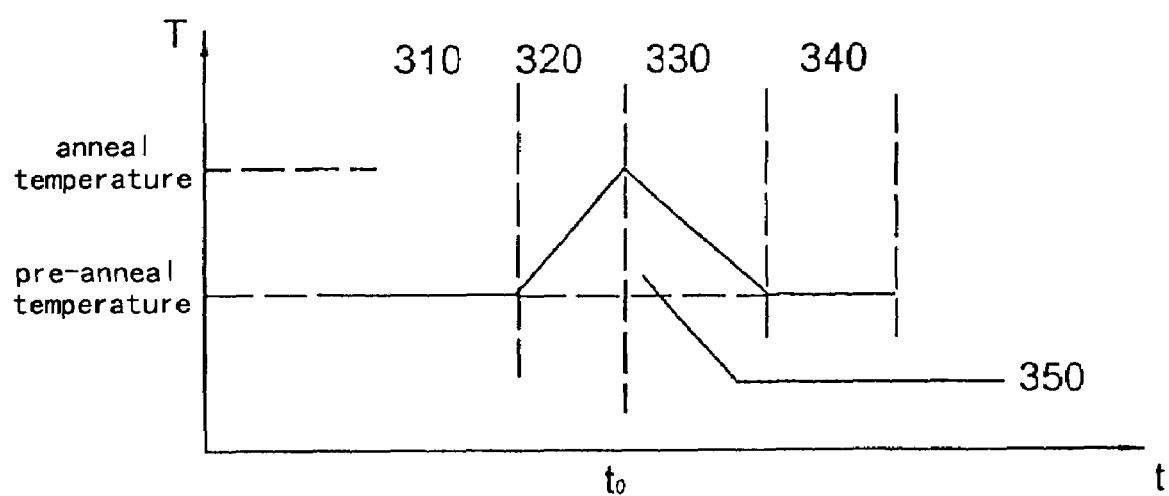
FIG. 3 is a simplified diagram for wafer temperature during spike anneal.

FIG. 3 is a simplified diagram for wafer temperature during spike anneal. This diagram is merely an example, which should not unduly limit the scope of the claims herein. During wafer anneals, wafer temperature changes with time. During time period 310, the wafer temperature remains at the pre-anneal temperature. During time period 320, the wafer temperature increases from the pre-anneal temperature to the anneal temperature. At time $t_0$, the wafer temperature reaches the anneal temperature. During time period 330, the wafer temperature decreases from the anneal temperature to the post-anneal temperature. During time period 340, the wafer temperature remains at the post-anneal temperature. The post-anneal temperature may equal or differ from the pre-anneal temperature. For example, the spike anneal is used for a feature size equal to or smaller than 0.1 µm. As shown in FIG. 3, the spike anneal contributes to the thermal budget in the amount represented by area 350. Area 350 is determined at least in part by the anneal temperature, the ramp-up rate during time period 320, and the ramp-down rate during time period 330. In order to reduce area 350, the ramp-up rate and ramp-down rate should usually be increased.

Figure 4:
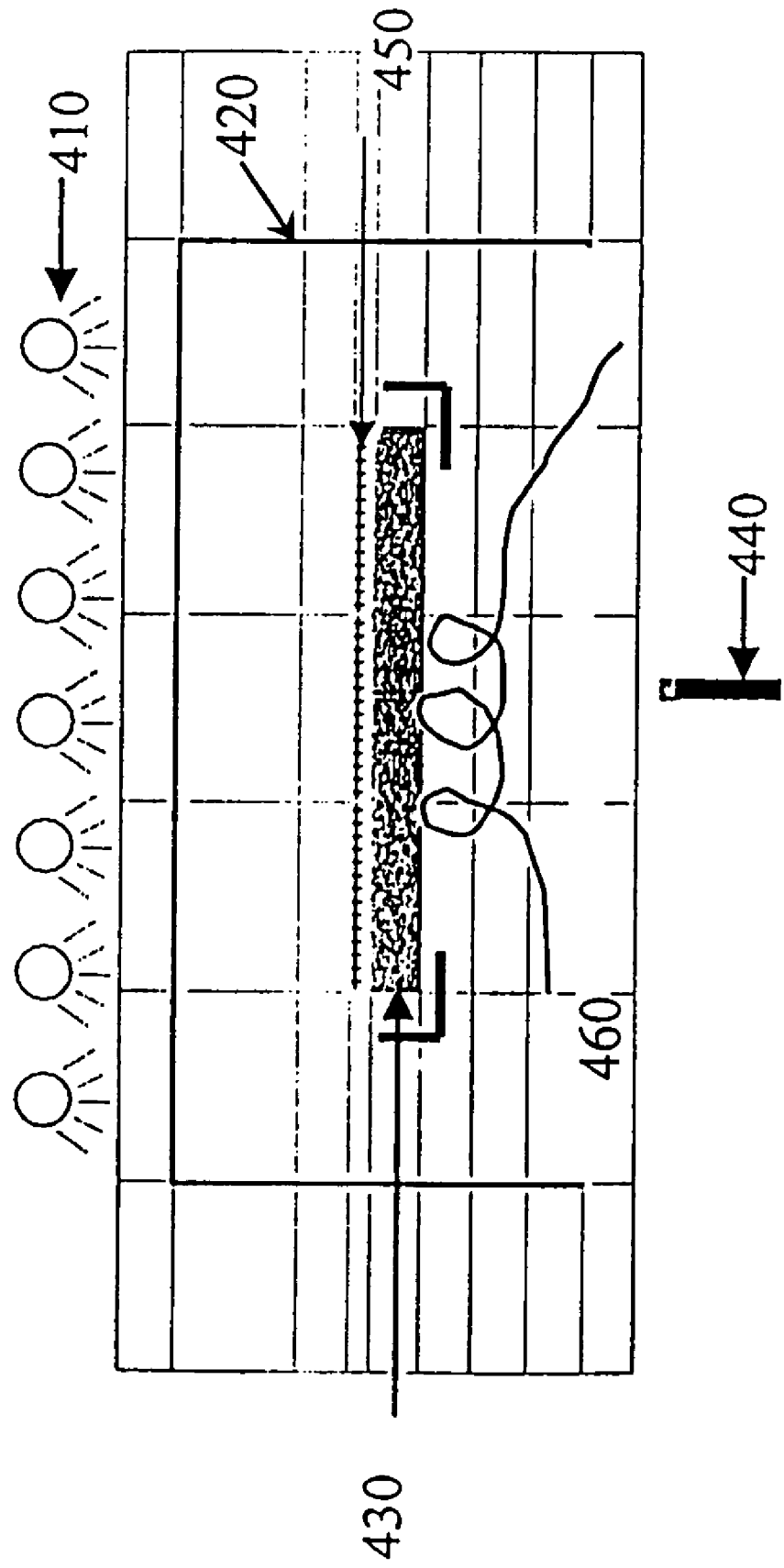
FIG. 4 is a simplified diagram for a processing apparatus capable of performing spike anneals.

FIG. 4 is a simplified diagram for a processing apparatus capable of performing spike anneals. This diagram is merely an example, which should not unduly limit the scope of the claims herein. Apparatus 400 includes at least lamps 410, quartz chamber 420, wafer support 430, and wafer temperature sensor 440. During spike anneal, wafer 450 is placed onto wafer support 430. In time period 320, lamps 410 are usually turned on in order to heat up wafer 440. In time period 330, lamps 410 are usually turned off in order to allow wafer 440 to cool down. Additionally, gas 460 flows through the vicinity of wafer 450 in order to improve the ramp-down rate. Gas 460 is usually at room temperature and composed of nitrogen, helium, or other gas.

Figure 5:
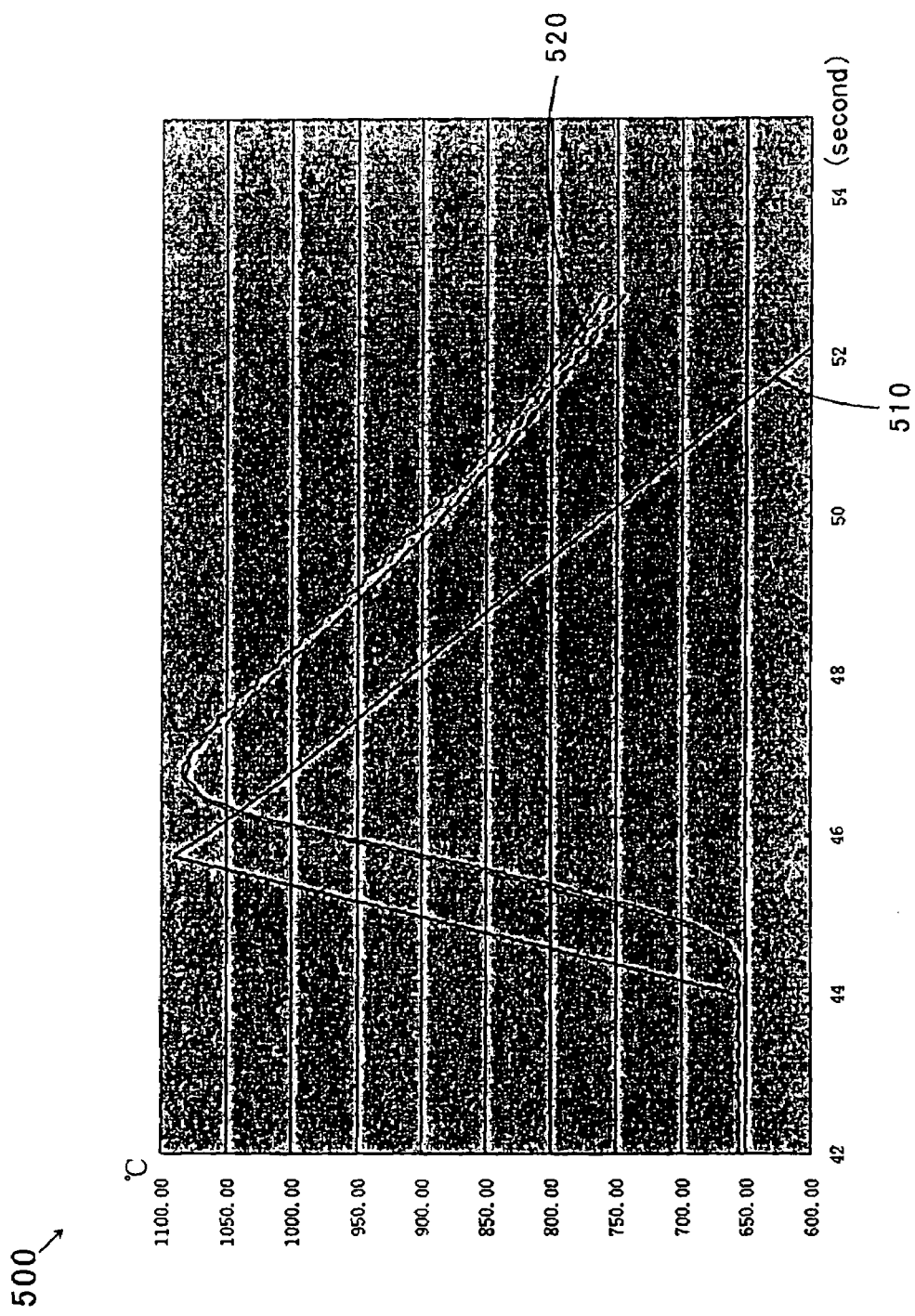
FIG. 5 is a measured diagram for wafer temperature as a function of time during spike anneal.

FIG. 5 is a measured diagram for wafer temperature as a function of time during spike anneal. This diagram is merely an example, which should not unduly limit the scope of the claims herein. One of ordinary skill in the art would recognize many variations, alternative, and modification. As shown in FIG. 5, diagram 500 includes a vertical temperature axis and a horizontal time axis. Curve 510 represents the target wafer temperature as a function of time. Curves 520 represents the measured wafer temperature as a function of time. Curves 520 are measured by temperature sensors located at various parts of wafer 440. As shown in FIG. 5, each of curves 520 has the ramp-up rate significantly higher than the ramp-down rate. In order to reduce the anneal temperature, the ramp-down rate needs to be increased.

The limited ramp-down rate may result from several mechanisms. As shown in FIG. 4, during the ramping down, lamps 410 are turned off. Nonetheless lamps 410 still have an elevated temperature in comparison to the post-anneal temperature. Additionally, quartz chamber 420 is also hotter than the post-anneal temperature. Hence lamps 410 and quartz chamber 420 remain as heat sources which hamper the cooling down of wafer 450.

Figure 6:
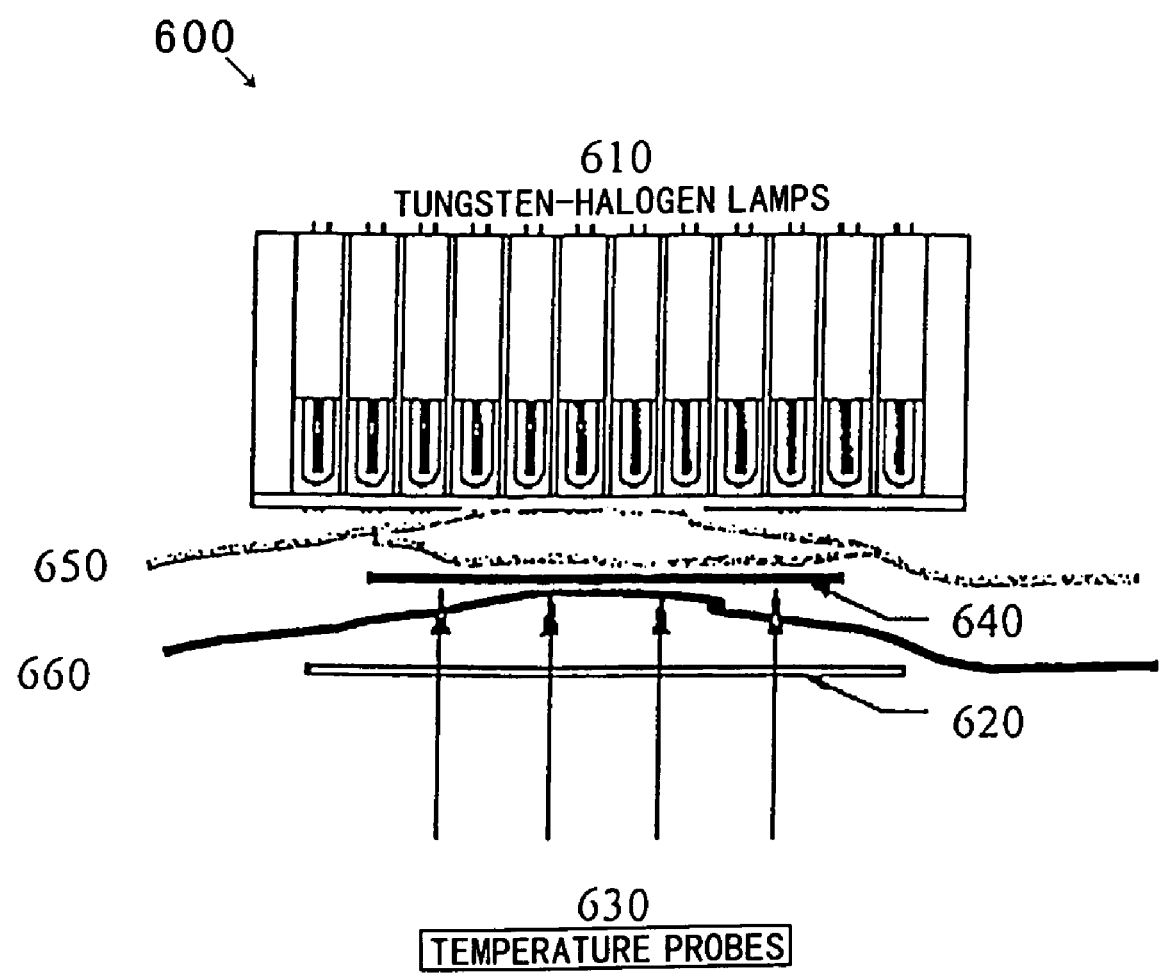
FIG. 6 is a simplified apparatus for rapid cooling down of annealed wafer according to one embodiment of the present invention.

FIG. 6 is a simplified apparatus for rapid cooling down of annealed wafer according to one embodiment of the present invention. This diagram is merely an example, which should not unduly limit the scope of the claims herein. One of ordinary skill in the art would recognize many variations, alternatives, and modifications. As shown in FIG. 6, apparatus 600 includes lamps 610, reflector plate 620, and temperature probes 630. Lamps 610 may be tungsten-halogen lamps, or other lamps. During the spike anneal, wafer 640 should be heated up and cooled down. Temperature probes 630 measure wafer temperature at various locations. During cooling down of wafer 640, gas 650 flows through vicinity of lamps 610. Additionally gas 660 also flows through vicinity of wafer 640. Gases 650 and 660 each include nitrogen, helium, or combination thereof. The flow rates of gases 650 and 660 ranges from 5 slm to 30 slm respectively. The temperatures of gases 650 and 660 may be adjusted to below room temperature, such as −10° C.

Figure 7:
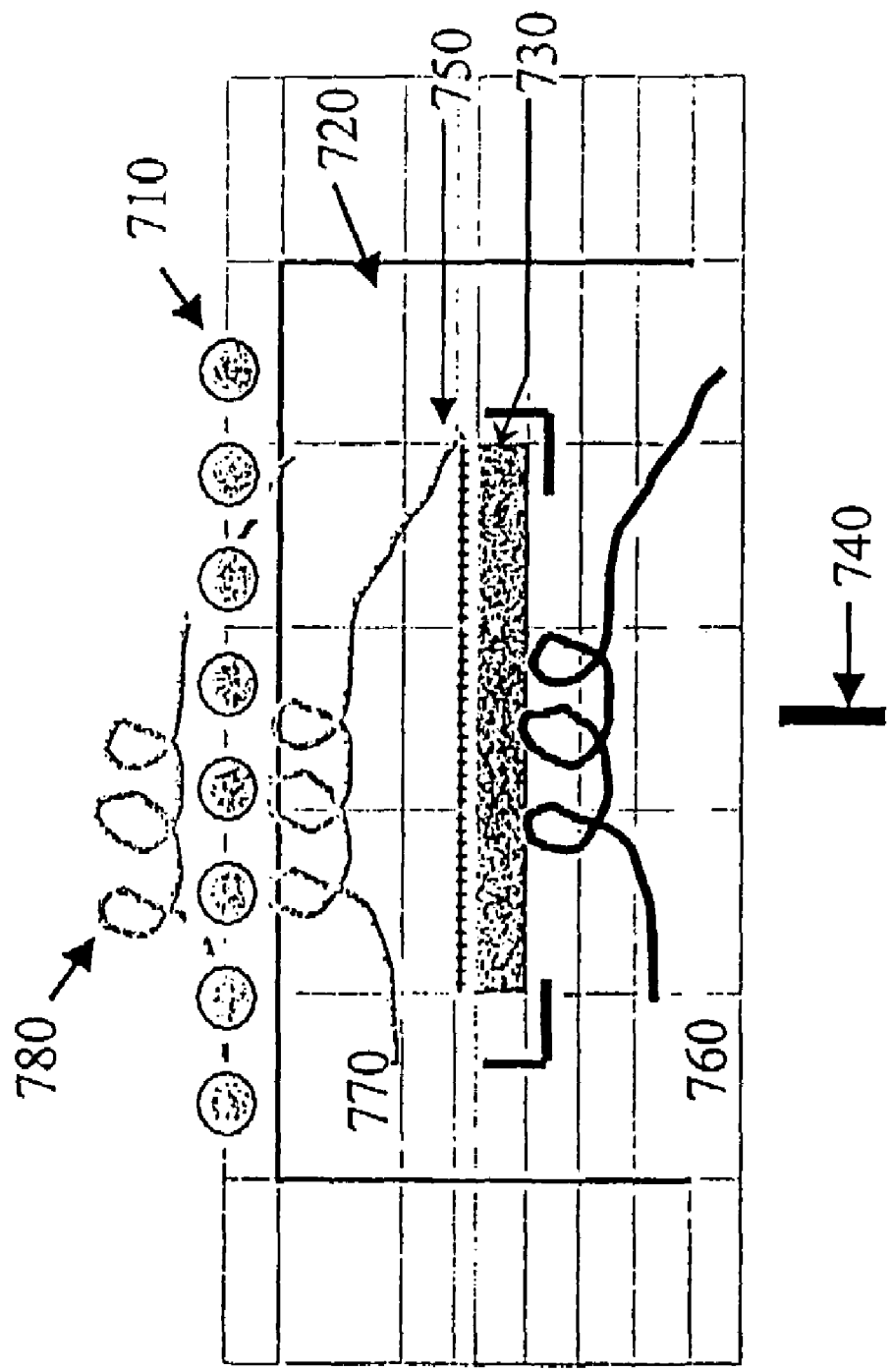
FIG. 7 is a simplified apparatus for rapid cooling down of annealed wafer according to another embodiment of the present invention.

FIG. 7 is a simplified apparatus for rapid cooling down of annealed wafer according to another embodiment of the present invention. This diagram is merely an example, which should not unduly limit the scope of the claims herein. One of ordinary skill in the art would recognize many variations, alternatives, and modifications. Apparatus 700 includes at least lamps 710, quartz chamber 720, wafer support 730, and wafer temperature sensor 740. During spike anneal, wafer 750 is placed onto wafer support 730. During the spike anneal, wafer 750 should be heated up and cooled down. Temperature sensor 740 measures wafer temperature. During cooling down of wafer 750, gas 760 flows through vicinity of wafer 750. Additionally gas 770 flows through vicinity of walls of quartz chamber 720. Moreover gas 780 flows through vicinity of lamps 710. Gases 760, 770 and 780 each include nitrogen, helium, or combination thereof. The flow rates of gases 760, 770 and 780 ranges from 5 slm to 30 slm respectively. The temperatures of gases 760, 770 and 780 may be adjusted to below room temperature, such as −10° C.

Figure 8:
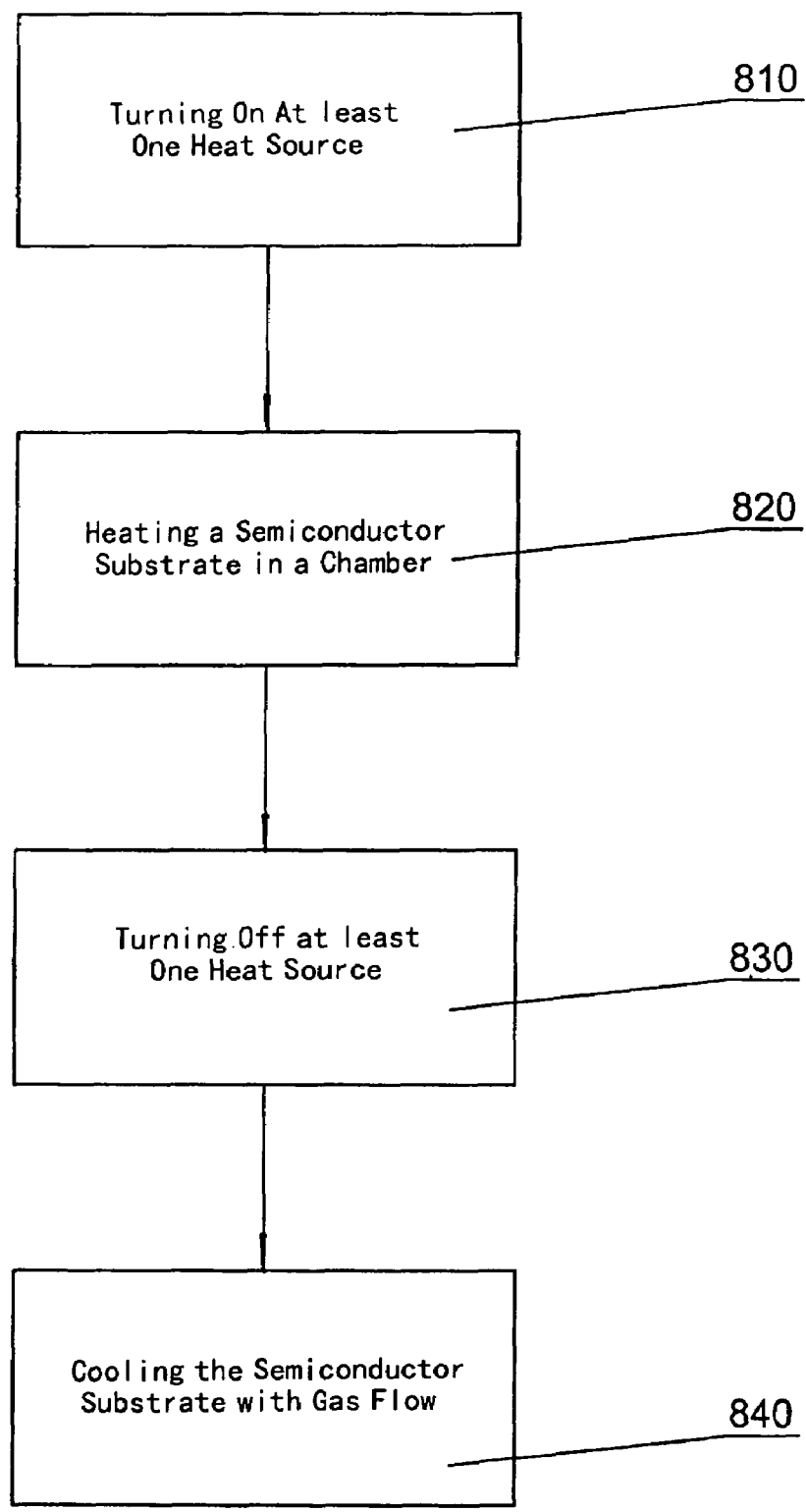
FIG. 8 is a simplified method for rapid cooling down of annealed wafer according to an embodiment of the present invention.

FIG. 8 is a simplified method for rapid cooling down of annealed wafer according to an embodiment of the present invention. This diagram is merely an example, which should not unduly limit the scope of the claims herein. One of ordinary skill in the art would recognize many variations, alternatives, and modifications. Method 800 includes process 810 for turning on at least one heat source, process 820 for heating a semiconductor substrate in a chamber, process 830 for turning off at least one heat source, and process 840 for cooling the semiconductor substrate with gas flow. Although the above has been shown using processes 810, 820, 830 and 840, there can be many alternatives, modifications, and variations. For example, some of the functional components may be expanded and/or combined. Other functional components may be inserted to those noted above. A process for maintaining the temperature of the semiconductor substrate at the anneal temperature value may be inserted between processes 820 and 830. Depending upon the embodiment, the specific functional component may be replaced. Further details of these functional components are found throughout the present specification and more particularly below.

At process 810, at least one heat source is turned on. For example, the at least one heat source includes lamps 610 as shown in FIG. 6 or lamps 710 as shown in FIG. 7. At process 820, the semiconductor substrate absorbs the energy from the at least one heat source. The temperature of the semiconductor substrate increases from the pre-anneal temperature to the anneal temperature. The semiconductor substrate may include various device components. For example, the semiconductor substrate includes a source region with a source LDD region and a drain region with a drain LDD region. At process 830, the at least one heat source is turned off. For example, the at least one heat source includes lamps 610 as shown in FIG. 6 or lamps 710 as shown in FIG. 7.

At process 840, the temperature of the semiconductor substrate decreases from the anneal temperature to the post-anneal temperature. The post-anneal temperature is usually lower than the anneal temperature. Additionally, the post-anneal temperature may equal the anneal temperature. Also at process 840, a first gas flows in the vicinity of at least one wall of the chamber, a second gas flows in the vicinity of the at least one heat source, and a third gas flows in the vicinity of the semiconductor substrate. The temperatures of the first gas, the second gas, and the third gas each is lower than the post-anneal temperature. For example, the temperatures of the first gas, the second gas, and the third gas each equal −10° C. The first gas, the second gas, and the third gas may each include nitrogen, helium, or other gas component.

As discussed above and further emphasized here, one of ordinary skill in the art would recognize many variations, alternatives, and modifications. For example, at process 840, only one or two of the three gases are used. As another example, the temperatures of the three gases have different temperature values. Usually, a gas with a lower temperature can improve the cooling rate of the semiconductor substrate more effectively than a gas with a higher temperature. Moreover, the apparatuses described in FIGS. 6 and 7 can perform all or some processes described above.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for annealing a semiconductor substrate, the method comprising:
    turning on at least one heat source;
    heating a semiconductor substrate in a chamber;
    turning off the at least one heat source;
    cooling the semiconductor substrate in the chamber;
    wherein
    the heating a semiconductor substrate includes raising a temperature of the semiconductor substrate from a first temperature value to a second temperature value;
    the cooling the semiconductor substrate includes lowering the temperature of the semiconductor substrate from the second temperature value to a third temperature value;
    the heating a semiconductor substrate includes absorbing an energy from the at least one heat source by the semiconductor substrate;
    the cooling the semiconductor substrate includes flowing a first gas in a vicinity of at least one wall of the chamber, flowing a second gas in a vicinity of the at least one heat source, and flowing a third gas in a vicinity of the semiconductor substrate;
    a first temperature of the first gas is lower than the second temperature value;
    a second temperature of the second gas is lower than the second temperature value;
    a third temperature of the third gas is lower than the second temperature value;
    wherein the first temperature of the first gas, the second temperature of the second gas, and the third temperature of the third gas are provided at below room temperature and the first temperature, the second temperature, and the third temperature each equals −10° C.

2. The method of claim 1 wherein the first gas, the second gas, and the third gas each comprise at least one selected from a group consisting of nitrogen and helium.

3. The method of claim 1, the method further comprising maintaining the temperature of the semiconductor substrate at the second temperature value.

4. The method of claim 1 wherein the semiconductor substrate comprises a source region and a drain region, the source region including a source LDD region, the drain region including a drain LDD region.

5. The method of claim 1 wherein the first temperature, the second temperature, and the third temperature each is lower than the third temperature value.

6. A method for annealing a semiconductor substrate, the method comprising:
    heating a semiconductor substrate in a chamber;
    cooling the semiconductor substrate in the chamber;
    wherein
    the heating a semiconductor substrate includes raising a temperature of the semiconductor substrate from a first temperature value to a second temperature value;
    the cooling the semiconductor substrate includes lowering the temperature of the semiconductor substrate from the second temperature value to a third temperature value;
    the heating a semiconductor substrate includes absorbing an energy from at least one heat source by the semiconductor substrate;
    the cooling the semiconductor substrate includes flowing a first gas in a vicinity of at least one wall of the chamber, flowing a second gas in a vicinity of the at least one heat source, and flowing a third gas in a vicinity of the semiconductor substrate;
    a first temperature of the first gas is lower than the third temperature value;
    a second temperature of the second gas is lower than the third temperature value;
    a third temperature of the third gas is lower than the third temperature value;
    wherein the first temperature of the first gas, the second temperature of the second gas, and the third temperature of the third gas are provided at below room temperature and the first temperature, the second temperature, and the third temperature each equals −10° C.

7. The method of claim 6 wherein the first gas, the second gas, and the third gas each comprise at least one selected from a group consisting of nitrogen and helium.

8. The method of claim 6, further comprising maintaining the temperature of the semiconductor substrate at the second temperature value.

9. The method of claim 6, wherein the semiconductor substrate comprises a source region and a drain region, the source region including a source LDD region, the drain region including a drain LDD region.

10. A method for annealing a semiconductor substrate, the method comprising:
    heating a semiconductor substrate in a chamber;
    cooling the semiconductor substrate in the chamber;

wherein
the heating a semiconductor substrate includes raising a temperature of the semiconductor substrate from a first temperature value to a second temperature value;
the cooling the semiconductor substrate includes lowering the temperature of the semiconductor substrate from the second temperature value to a third temperature value;
the heating a semiconductor substrate includes absorbing an energy from at least one lamp by the semiconductor substrate;
the cooling the semiconductor substrate includes flowing a first gas in a vicinity of the at least one lamp, and flowing a second gas in a vicinity of the semiconductor substrate;
a first temperature of the first gas is lower than the third temperature value;
a second temperature of the second gas is lower than the third temperature value;
wherein the first temperature of the first gas, and the second temperature of the second gas, are provided at below room temperature and the first temperature and the second temperature each equals −10° C.

11. The method of claim 10 wherein the first gas, the second gas, and the third gas each comprise at least one selected from a group consisting of nitrogen and helium.

12. A method for annealing a semiconductor substrate, the method comprising:
turning on at least one heat source;
heating a semiconductor substrate in a chamber, the semiconductor substrate including a source region and a drain region, the source region including a source LDD region, the drain region including a drain LDD region;
turning off the at least one heat source;
cooling the semiconductor substrate in the chamber;
wherein
the heating a semiconductor substrate includes raising a temperature of the semiconductor substrate from a first temperature value to a second temperature value;
the cooling the semiconductor substrate includes lowering the temperature of the semiconductor substrate from the second temperature value to a third temperature value;
the heating a semiconductor substrate includes absorbing an energy from the at least one heat source by the semiconductor substrate;
the cooling the semiconductor substrate includes flowing a first gas in a vicinity of at least one wall of the chamber, flowing a second gas in a vicinity of the at least one heat source, and flowing a third gas in a vicinity of the semiconductor substrate;
a first temperature of the first gas is lower than the second temperature value;
a second temperature of the second gas is lower than the second temperature value;
a third temperature of the third gas is lower than the second temperature value;
wherein the first temperature of the first gas, the second temperature of the second gas, and the third temperature of the third gas are provided at below room temperature and the first temperature, the second temperature, and the third temperature each equals −10° C.

13. The method of claim 12 wherein the first gas, the second gas, and the third gas each comprise at least one selected from a group consisting of nitrogen and helium.

14. The method of claim 12, further comprising maintaining the temperature of the semiconductor substrate at the second temperature value.

15. The method of claim 12 wherein the first temperature value equals the third temperature value.

16. The method of claim 12 wherein the first temperature, the second temperature, and the third temperature each is lower than the third temperature value.

* * * * *